United States Patent
Lee et al.

(10) Patent No.: US 12,336,102 B2
(45) Date of Patent: Jun. 17, 2025

(54) BACKLIGHT UNIT AND DISPLAY DEVICE

(71) Applicant: LG DISPLAY CO., LTD., Seoul (KR)

(72) Inventors: Suhun Lee, Gyeonggi-do (KR); MyungJoon Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 210 days.

(21) Appl. No.: 18/351,423

(22) Filed: Jul. 12, 2023

(65) Prior Publication Data
US 2024/0080985 A1    Mar. 7, 2024

(30) Foreign Application Priority Data
Sep. 7, 2022  (KR) .......................... 10-2022-0113251

(51) Int. Cl.
*H05K 1/18*    (2006.01)
*G09G 3/32*    (2016.01)
*H05K 3/00*    (2006.01)

(52) U.S. Cl.
CPC .............. *H05K 1/181* (2013.01); *G09G 3/32* (2013.01); *H05K 3/0044* (2013.01); *H05K 2201/10106* (2013.01); *H05K 2201/10128* (2013.01)

(58) Field of Classification Search
CPC ......... G02F 1/133603; G02F 1/133605; G02F 1/133606; G09G 3/32; H05K 1/0274; H05K 1/181; H05K 3/0044; H05K 3/28; H05K 2201/10106; H05K 2201/10128; H05K 2201/2054
See application file for complete search history.

(56) References Cited

U.S. PATENT DOCUMENTS

2011/0007493 A1*  1/2011  Ishio ................. G02F 1/133606
257/E33.056

* cited by examiner

*Primary Examiner* — Nathan Milakovich
(74) *Attorney, Agent, or Firm* — Fenwick & West LLP (57) ABSTRACT

According to embodiments of the disclosure, it is possible to increase scattering effect and light reflectance in the area around the light source by increasing the ratio of the base layer exposed around the light source, which have protrusion patterns and have a higher reflectance than the cover layer and are positioned under the cover layer and the wiring layer of the printed circuit where the light source included in the backlight unit. Thus, there may be provided a backlight unit with enhanced light efficiency and image quality in the area around the light source and a display device including the same.

19 Claims, 7 Drawing Sheets

BACKLIGHT UNIT AND DISPLAY DEVICE

CROSS-REFERENCE TO RELATED APPLICATION

This application claims priority from Korean Patent Application No. 10-2022-0113251, filed on Sep. 7, 2022, which is hereby incorporated by reference for all purposes as if fully set forth herein.

BACKGROUND

Technical Field

Embodiments of the disclosure relate to a backlight unit and a display device.

Description of Related Art

A display device may include a display panel with multiple subpixels and various driving circuits for driving the subpixels. The display panel may display an image while the brightness of each of the plurality of subpixels is adjusted by various driving circuits.

The plurality of subpixels may include a light emitting element and may emit light on their own. Alternatively, the plurality of subpixels may receive light from the outside, adjust the amount of light emitted to the outside, and represent brightness according to image data.

When the plurality of subpixels receive light from the outside, the display device may include a separate light source device for supplying light to the display panel. Due to the light source device, the overall thickness of the display device may increase. When the thickness of the light source device is reduced, image quality may deteriorate.

BRIEF SUMMARY

Embodiments of the disclosure may provide a backlight unit with enhanced light efficiency and image quality without increasing the thickness and a display device including the same.

Embodiments of the disclosure may provide a display device including a display panel and a backlight unit supplying light to the display panel.

The backlight unit may include a printed circuit including a base layer, a wiring layer on the base layer, and a cover layer on the wiring layer, a plurality of light sources on the printed circuit, and a reflector positioned on the printed circuit and including a plurality of holes positioned corresponding to the plurality of light sources.

At least a portion of the cover layer may be removed in an area overlapping each of the plurality of holes to expose the base layer. An area of a portion where the base layer may be exposed is larger than an area of the cover layer.

Embodiments of the disclosure may provide a backlight unit comprising a printed circuit including a base layer, a wiring layer on the base layer, and a cover layer on the wiring layer, a plurality of light sources on the printed circuit and a reflector positioned on the printed circuit and including a plurality of holes positioned corresponding to the plurality of light sources, wherein at least a portion of the cover layer is removed in an area overlapping each of the plurality of holes to expose the base layer, and wherein an area of a portion where the base layer is exposed is larger than an area of the cover layer.

Embodiments of the disclosure may provide a backlight unit comprising a printed circuit and a plurality of light sources disposed on the printed circuit, wherein the printed circuit includes a first portion having a first reflectance around each of the plurality of light sources and a second portion having a second reflectance lower than the first reflectance, and wherein a vertical distance between the first portion and the light source is larger than a vertical distance between the second portion and the light source.

According to embodiments of the disclosure, the reflectance of the surroundings of the plurality of light sources included in the backlight unit may be enhanced, and the light efficiency and image quality of the backlight unit may be enhanced.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to accompanying drawings.

Figure 1:
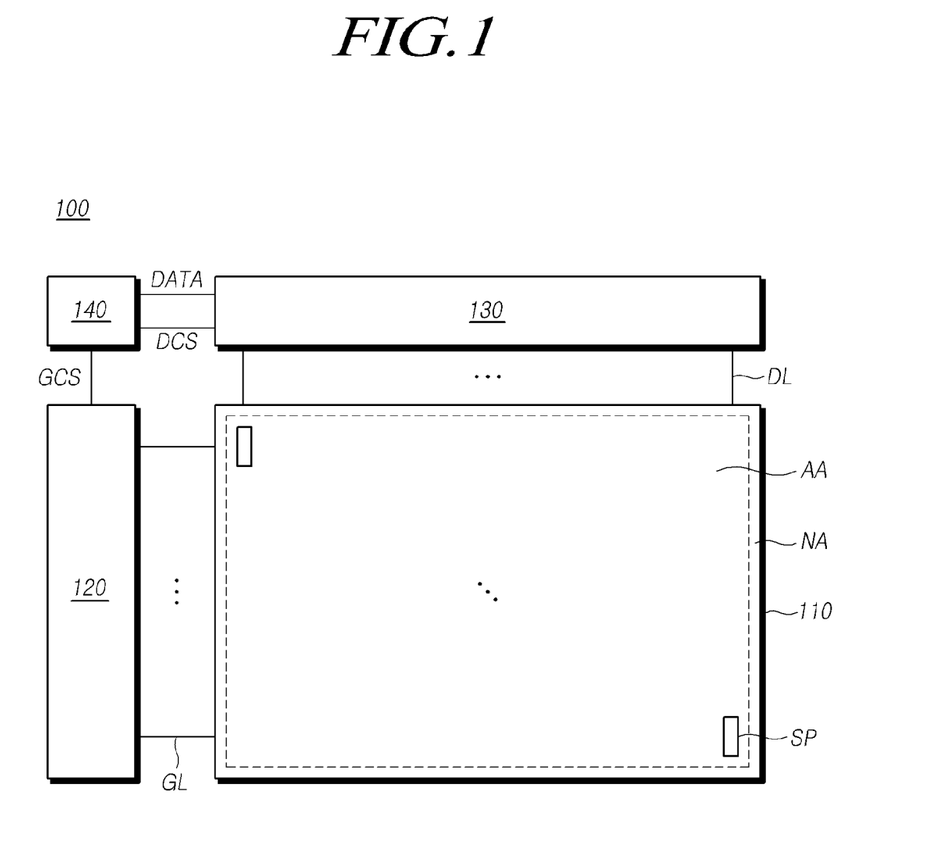
FIG. 1 is a view schematically illustrating a configuration of a display device according to embodiments of the disclosure.

FIG. 1 is a view schematically illustrating a configuration of a display device 100 according to embodiments of the disclosure.

Referring to FIG. 1, a display device 100 may include a display panel 110 and a gate driving circuit 120, a data driving circuit 130, and a controller 140 for driving the display panel 110.

The display panel 110 may include an active area AA in which a plurality of subpixels SP are disposed and a non-active area NA positioned outside the active area AA.

The display panel 110 may include a plurality of gate lines GL, a plurality of data lines DL, and subpixels SP at the crossings of the gate lines GL and the data lines DL.

The gate driving circuit 120 may be controlled by the controller 140 to sequentially output scan signals to the plurality of gate lines GL disposed in the display panel 110, controlling the driving timing of the subpixels SP.

The gate driving circuit 120 may include one or more gate driver integrated circuits GDIC. Depending on driving schemes, the gate driving circuit 120 may be positioned on only one side, or each of two opposite sides, of the display panel 110.

Each gate driver integrated circuit GDIC may be connected to a bonding pad of the display panel 110 in a tape automated bonding (TAB) manner or a chip on glass (COG) manner. Alternatively, each gate driver integrated circuit GDIC may be implemented in a gate in panel (GIP) type and directly disposed on the display panel 110. Alternatively, each gate driver integrated circuit GDIC may be integrated and disposed on the display panel 110. Alternatively, each gate driver integrated circuit GDIC may be implemented in a chip on film (COF) manner to be mounted on a film connected to the display panel 110.

The data driving circuit 130 receives image data DATA from the controller 140 and convert the image data DATA into an analog data voltage. The data driving circuit 130 outputs the data voltage to each data line DL according to the timing of applying a scan signal via the gate line GL, allowing each subpixel SP to represent a brightness according to the image data DATA.

The data driving circuit 130 may include one or more source driver integrated circuits SDIC.

Each source driver integrated circuit SDIC may include a shift register, a latch circuit, a digital-to-analog converter, an output buffer, and the like.

Each source driver integrated circuit SDIC may be connected to a bonding pad of the display panel 110 in a tape automated bonding (TAB) manner or a chip on glass (COG) manner. Alternatively, each source driver integrated circuit SDIC may be directly disposed on the display panel 110. Alternatively, each source driver integrated circuit SDIC may be integrated and disposed on the display panel 110. Alternatively, each source driver integrated circuit SDIC may be implemented by a chip on film (COF) method. In this case, each source driver integrated circuit SDIC may be mounted on a film connected to the display panel 110 and may be electrically connected to the display panel 110 through lines on the film.

The controller 140 may supply various control signals to the gate driving circuit 120 and the data driving circuit 130 and control the operation of the gate driving circuit 120 and the data driving circuit 130.

The controller 140 may be mounted on a printed circuit board or a flexible printed circuit and may be electrically connected with the gate driving circuit 120 and the data driving circuit 130 through the printed circuit board or the flexible printed circuit.

The controller 140 may enable the gate driving circuit 120 to output scan signals according to the timing set in each frame, convert image data received from the outside to meet the data signal format used by the data driving circuit 130, and output the resultant image data DATA to the data driving circuit 130.

The controller 140 receives, from the outside (e.g., a host system), various timing signals including a vertical synchronization signal VSYNC, a horizontal synchronization signal HSYNC, an input data enable signal DE, and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse GSP, a gate shift clock GSC, and a gate output enable signal GOE.

The gate start pulse GSP controls the operation start timing of one or more gate driver integrated circuits GDICs constituting the gate driving circuit 120. The gate shift clock GSC is a clock signal commonly input to one or more gate driver integrated circuits GDICs and controls the shift timing of the scan signals. The gate output enable signal GOE designates timing information about one or more gate driver integrated circuits GDICs.

To control the data driving circuit 130, the controller 140 outputs various data control signals DCS including, e.g., a source start pulse SSP, a source sampling clock SSC, and a source output enable signal SOE.

The source start pulse SSP controls the data sampling start timing of one or more source driver integrated circuits SDICs constituting the data driving circuit 130. The source sampling clock SSC is a clock signal for controlling the sampling timing of data in each source driver integrated circuit (SDIC). The source output enable signal SOE controls the output timing of the data driving circuit 130.

The display device 100 may further include a power management integrated circuit that supplies various voltages or currents to, e.g., the display panel 110, the gate driving circuit 120, and the data driving circuit 130 or controls various voltages or currents to be supplied.

Each subpixel SP may be an area defined by the intersection of the gate line GL and the data line DL, and at least one circuit element may be disposed therein. Further, depending on the type of the display device 100, a light emitting element or a liquid crystal layer may be disposed in each subpixel SP.

For example, when the display device 100 is a liquid crystal display device, a liquid crystal layer may be disposed in each subpixel SP. The display device 100 may include a backlight unit supplying light to the display panel 110. The backlight unit may include a light emitting element and various optical elements.

Figure 2:
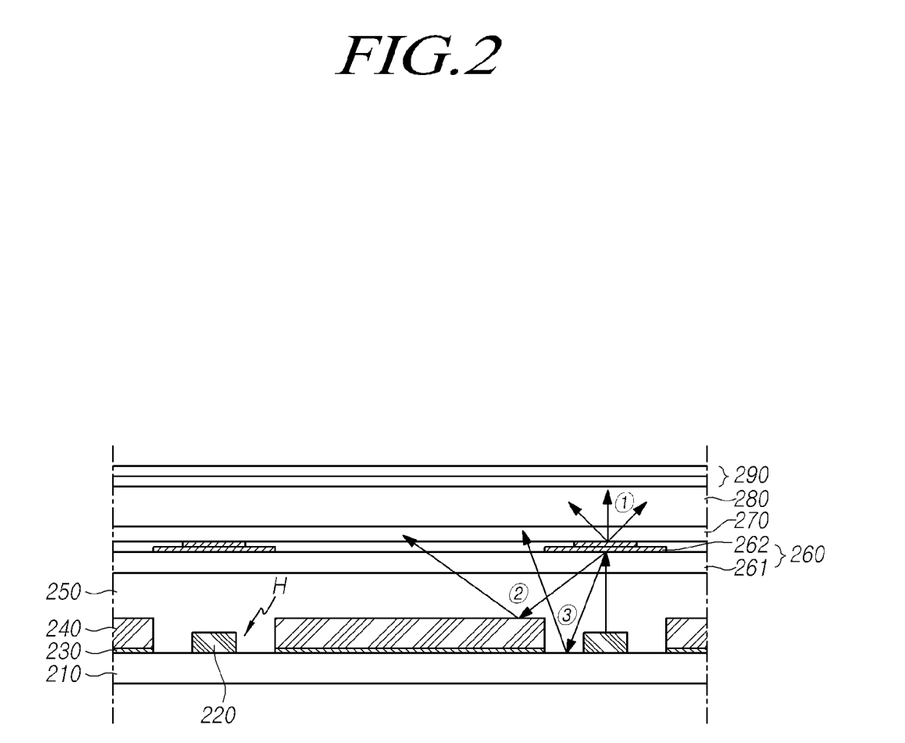
FIG. 2 is a view illustrating an example of a cross-sectional structure of a backlight unit included in a display device according to embodiments of the disclosure.

FIG. 2 is a view illustrating an example of a cross-sectional structure of a backlight unit included in a display device according to embodiments of the disclosure.

Referring to FIG. 2, a backlight unit according to embodiments of the disclosure may include a plurality of light sources 220. The light source 220 may be, e.g., a light emitting diode (LED) or a mini light emitting diode (μLED) having a size of hundreds of μm or a micro light emitting diode (micro LED) having a size of several tens of μm.

The plurality of light sources 220 may be mounted on a printed circuit 210. The plurality of light sources 220 may emit light according to electrical signals supplied through lines of the printed circuit 210. In some cases, the plurality of light sources 220 may be disposed on a substrate formed of glass. A line is disposed on the substrate, and the light source 220 may receive an electrical signal through the line on the substrate. In this case, a circuit element for controlling the light source 220 may be further disposed on the substrate in addition to the line.

A reflector 240 may be disposed on the printed circuit 210. The reflector 240 may be adhered to the printed circuit 210 through an adhesive layer 230. The adhesive layer 230 may be, e.g., a double-sided tape, but is not limited thereto.

The reflector 240 may include a plurality of holes H. Each of the plurality of holes H may be positioned corresponding to each of the plurality of light sources 220.

The light source 220 may be positioned inside the hole H included in the reflector 240. The height of the top of the reflector 240 may be higher than the height of the top of the light source 220.

A light source protection layer 250 may be disposed on the light source 220 and the reflector 240. The light source protection layer 250 may be formed of, e.g., resin, but is not limited thereto. The light source protection layer 250 may provide a function of protecting the light source 220. The light source protection layer 250 may provide a function of guiding light emitted from the light source 220. Several sheets providing optical functions may be disposed on the light source protection layer 250.

For example, a light path control film 260 may be positioned on the light source protection layer 250. The light path control film 260 may include a substrate film 261 and a light path control pattern 262.

The substrate film 261 may be formed of a transparent material, and may be formed of, e.g., polyethylene terephthalate (PET) or polycarbonate (PC), but is not limited thereto.

A plurality of light path control patterns 262 may be disposed on at least one of upper and lower surfaces of the substrate film 261. The light path control pattern 262 may be formed of a high-reflectance material, e.g., $TiO_2$, but is not limited thereto. The light path control pattern 262 may be formed of a single layer or a plurality of layers. The thickness of the light path control pattern 262 may be constant. The thickness of the central portion of the light path control pattern 262 may be larger than the thickness of the edge portion.

Each of the plurality of light path control patterns 262 may be positioned corresponding to each of the plurality of light sources 220. The plurality of light path control patterns 262 may be positioned respectively corresponding to the plurality of holes H included in the reflector 240.

The size and shape of the light path control pattern 262 may correspond to the size and shape of the hole H.

The light path control pattern 262 may be positioned on the light source 220 and may reflect at least a portion of the light emitted from the light source 220 and spread the light emitted from the light source 220.

A color conversion sheet 270, a diffusion plate 280 and an optical sheet 290 may be disposed on the light path control film 260.

The color conversion sheet 270 may include a material that converts the wavelength of light emitted from the light source 220, such as a phosphor or a quantum dot. For example, when the light source 220 emits blue light, the color conversion sheet 270 may include a material that excites blue light to emit green light and red light. When the light source 220 emits white light or a color conversion material is disposed around the light source 220, the color conversion sheet 270 may not be disposed.

The optical sheet 290 may include, e.g., a prism sheet or a diffusion sheet.

The light emitted from the light source 220 may be supplied to the display panel 110 through several sheets including the light path control film 260. Light efficiency and image quality may be enhanced by a sheet providing several optical functions.

The path of light emitted from the light source 220 may be controlled by the light path control pattern 262 positioned on the light source 220.

For example, part of the light emitted from the light source 220 may be emitted onto the light path control pattern 262 as shown in ①. Since the reflectance of the light path control pattern 262 is very high, the amount of light emitted onto the light path control pattern 262 may be very small.

Part of the light emitted from the light source 220 may be reflected by the light path control pattern 262 and reflected again by the reflector 240 positioned under the light path control pattern 262 as shown in ②. The light reflected by the reflector 240 may travel through the light source protection layer 250 and may be emitted upward from an area between the light sources 220. The light emitted from the light source 220 may be uniformly supplied by the light path control pattern 262.

Part of the light emitted from the light source 220 may be reflected by the light path control pattern 262 and reach the printed circuit 210 positioned inside the hole H as shown in ③. Alternatively, the light emitted to the side of the light source 220 may reach the printed circuit 210.

The light reaching the printed circuit 210 may be reflected from an upper surface of the printed circuit 210. The light reflected from the upper surface of the printed circuit 210 may be supplied back to the upper portion of the light source 210.

Embodiments of the disclosure may provide a technique that may enhance light reflectance and diffusion performance by the printed circuit 210 positioned inside the hole H of the reflector 240 where the light source 220 is positioned, thereby enhancing the light efficiency and image quality of the backlight unit.

FIGS. 3, 4, 5, and 6 are views illustrating examples of a planar structure and a cross-sectional structure of an area where a light source included in a backlight unit according to embodiments of the disclosure is disposed. FIG. 7 is a view illustrating an example of a process of forming a protrusion pattern on a printed circuit included in a backlight unit according to embodiments of the disclosure.

Figure 3:
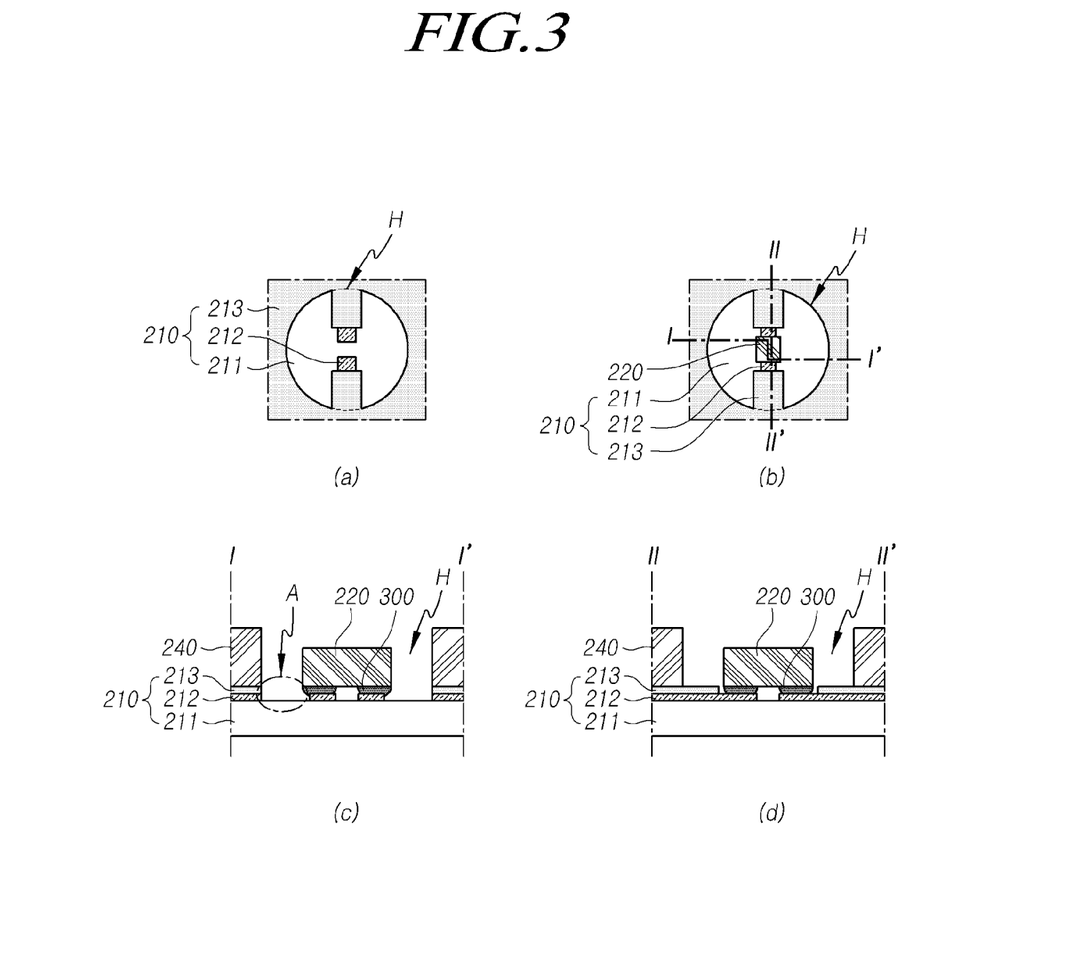
FIGS. 3, 4, 5, and 6 are views illustrating examples of a planar structure and a cross-sectional structure of an area where a light source included in a backlight unit according to embodiments of the disclosure is disposed.

Referring to FIG. 3, part (a) of FIG. 3 illustrates an example planar structure of the printed circuit 210 in the area where the light source 220 is positioned. Part (b) of FIG. 3 illustrates an example structure in which the light source 220 is disposed on the printed circuit 210 shown in part (a). Part (c) of FIG. 3 illustrates a cross-sectional structure of portion I-I' in the structure shown in part (b), and also illustrates a structure in which the reflector 240 is disposed on the printed circuit 210. Part (d) of FIG. 3 illustrates a cross-sectional structure of portion II-II' in the structure shown in part (b), and also illustrates a structure in which the reflector 240 is disposed on the printed circuit 210. FIG. 3 illustrates a structure in which the adhesive layer 230 between the reflector 240 and the printed circuit 210 is omitted for convenience.

Referring to FIG. 3, the printed circuit 210 may include a base layer 211, a wiring layer 212 on the base layer 211, and a cover layer 213 on the wiring layer 212.

At least a portion of the cover layer 213 may be removed in an area overlapping the hole H of the reflector 240. The cover layer 213 may be removed to a point where it overlaps at least a portion of the boundary of the hole H.

In an area overlapping the hole H, the cover layer 213 may be positioned in at least a portion of the area where the wiring layer 212 is disposed. The cover layer 213 may be disposed while exposing only a portion of the wiring layer 212.

The base layer 211 may be exposed and disposed in the area where the cover layer 213 is removed. The exposed portion of the base layer 211 may overlap at least a portion of the boundary of the hole H.

As shown in parts (a) and (b) of FIG. 3, the area of the exposed portion of the base layer 211 in the area overlapping the hole H may be larger than the area of the portion where the cover layer 213 is disposed.

A portion of the exposed portion of the wiring layer 212 may be electrically connected to the light source 220 by the conductive layer 300. A portion of the wiring layer 212 overlapping the light source 220 may be covered by the light source 220.

The wiring layer 212 may be exposed in a portion of an area where there is a gap between the light source 220 and the cover layer 213. Since the cover layer 213 covers the wiring layer 212 and is removed from an area overlapping the hole H, the gap between the light source 220 and the cover layer 213 may not be constant.

The wiring layer 212 may be disposed while being exposed in a portion of an area where the gap between the light source 220 and the cover layer 213 is the smallest. The wiring layer 212 may be exposed in a "-" shape between the light source 220 and the cover layer 213. The width of the wiring layer 212 may be smaller than the width of the light source 220. The exposed portion of the wiring layer 212 may be minimized.

The area of the exposed portion of the wiring layer 212 in the area overlapping the hole H may be smaller than the area of the exposed portion of the base layer 211. The area of the exposed portion of the wiring layer 212 may be smaller than the area of the exposed portion of the cover layer 213.

The base layer 211 may have, e.g., a first reflectance. The cover layer 213 may have, e.g., a second reflectance lower than the first reflectance. The wiring layer 212 may have, e.g., a third reflectance lower than the second reflectance.

The base layer 211 may be formed of, e.g., white epoxy, but is not limited thereto. The cover layer 213 may be formed of, e.g., photo solder resist (PSR), but is not limited thereto. The wiring layer 212 may be formed of, e.g., copper (Cu), but is not limited thereto.

The reflectance of the base layer 211 may be larger than that of the cover layer 213 and may be smaller than that of the reflector 240.

The ratio of the area occupied by the base layer 211 having the highest reflectance among the components of the printed circuit 210 in the area overlapping the hole H may be the largest. The cover layer 213 may be disposed to minimize the area where the wiring layer 212 having low reflectivity is exposed and to maximize the area where the base layer 211 is exposed.

When the portion where the base layer 211 having high reflectance is exposed is referred to as a first portion and the portion where the cover layer 213 is disposed is referred to as a second portion, the vertical distance between the light source 220 and the first portion may be larger than the vertical distance between the light source 220 and the second portion. The reflectance of the upper surface of the printed circuit 210 positioned farther from the light source 220 may be greater.

Since the base layer 211 having high reflectance is disposed in a wider proportion in the area overlapping the hole H, the efficiency of reflection of light emitted and scattered inside the hole H on the printed circuit 210 may be increased.

As indicated by the label "A" in part (c) of FIG. 3, the cover layer 213 is removed to expose the base layer 211, increasing the reflectance by the printed circuit 210 inside the hole H.

As shown in part (d) of FIG. 3, the cover layer 213 may cover a portion where the wiring layer 212 is disposed to be electrically connected to the light source 220 and may be disposed in a minimum area.

The overall reflectance inside the hole H may be enhanced by maximizing the portion where the base layer 211 having high reflectance is exposed while minimizing the portion where the wiring layer 212 having low reflectance is exposed.

The boundary of the area where the cover layer 212 is removed may match a portion of the boundary of the hole H. In some cases, the boundary of the area where the cover layer 212 is removed may be positioned inside the boundary of the hole H. Alternatively, at least a portion of the boundary of the area where the cover layer 212 is removed may be positioned outside the boundary of the hole H.

Figure 4:
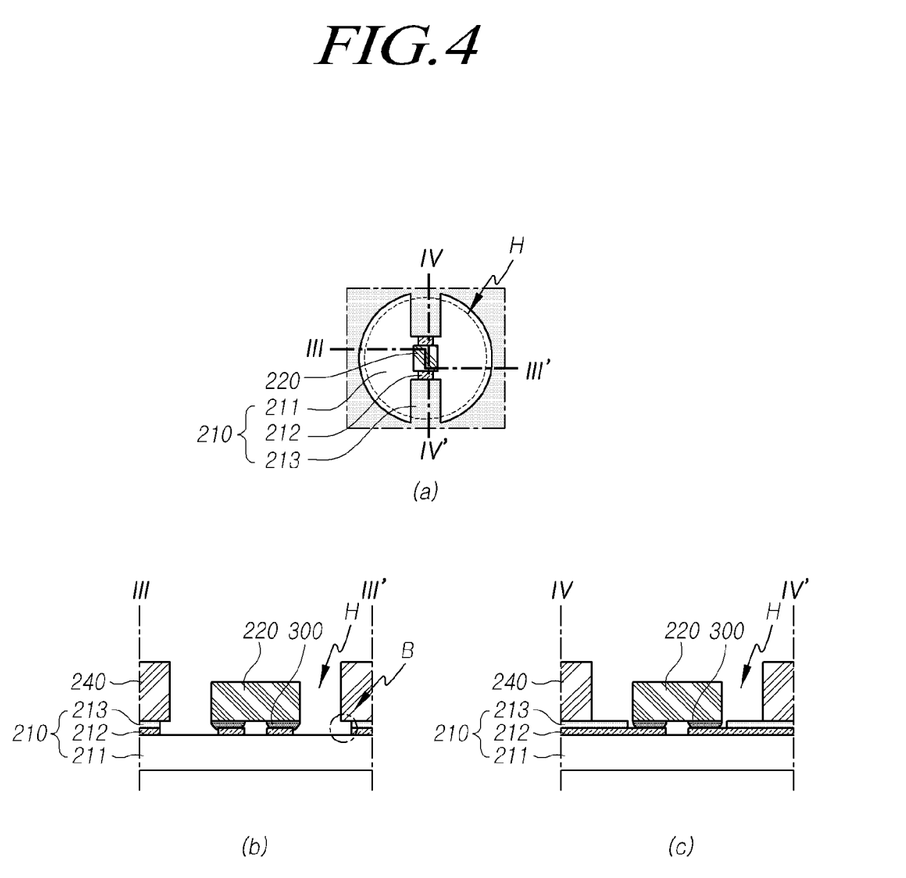

Referring to FIG. 4, part (a) of FIG. 4 illustrates an example planar structure in which a light source 220 is disposed on a printed circuit 210 in an area where the light source 220 is positioned. Part (b) of FIG. 4 illustrates an example cross-sectional structure of section III-III' in the structure shown in part (a). Part (c) of FIG. 4 illustrates an example cross-sectional structure of section VI-VI' in the structure shown in part (a).

Referring to FIG. 4, at least a portion of the cover layer 213 of the printed circuit 210 may be removed in an area overlapping the hole H. The base layer 211 may be exposed in the area where the cover layer 213 is removed.

The cover layer 213 may be disposed while covering a portion of the wiring layer 212.

A portion of the wiring layer 212 may be positioned outside the cover layer 213 to be connected to the light source 220. The wiring layer 212 may be exposed in a partial area between the light source 220 and the cover layer 213.

A portion of the portion where the cover layer 213 is removed may be positioned outside the boundary of the hole H. A portion of the portion where the base layer 211 is exposed may be positioned outside the boundary of the hole H.

As indicated by the label "B" in part (b) of FIG. 4, the cover layer 213 and the wiring layer 212 may be positioned outside the boundary of the hole H. A portion of the area where the cover layer 213 is removed may overlap the reflector 240. A portion of the portion where the base layer 211 is exposed may overlap the reflector 240.

A portion of the light source protection layer 250 disposed on the light source 220 and the reflector 240 may be positioned between the reflector 240 and the base layer 211.

Since the cover layer 213 and the wiring layer 212 are positioned outside the boundary of the hole H, the base layer 211 may be exposed and positioned in the area inside the hole H and adjacent to the boundary of the hole H.

Since the light emitted from the light source 220 is diffused in various directions, the reflection efficiency of light in the area of the hole H may further be enhanced by the structure in which the base layer 211 is positioned to the outside of the boundary of the hole H of the reflector 240.

In some cases, the wiring layer 212 may not be positioned under the cover layer 213 positioned under the reflector 240. Alternatively, the cover layer 213 may be disposed while covering the side surface of the wiring layer 212 between the reflector 240 and the base layer 211.

Figure 5:
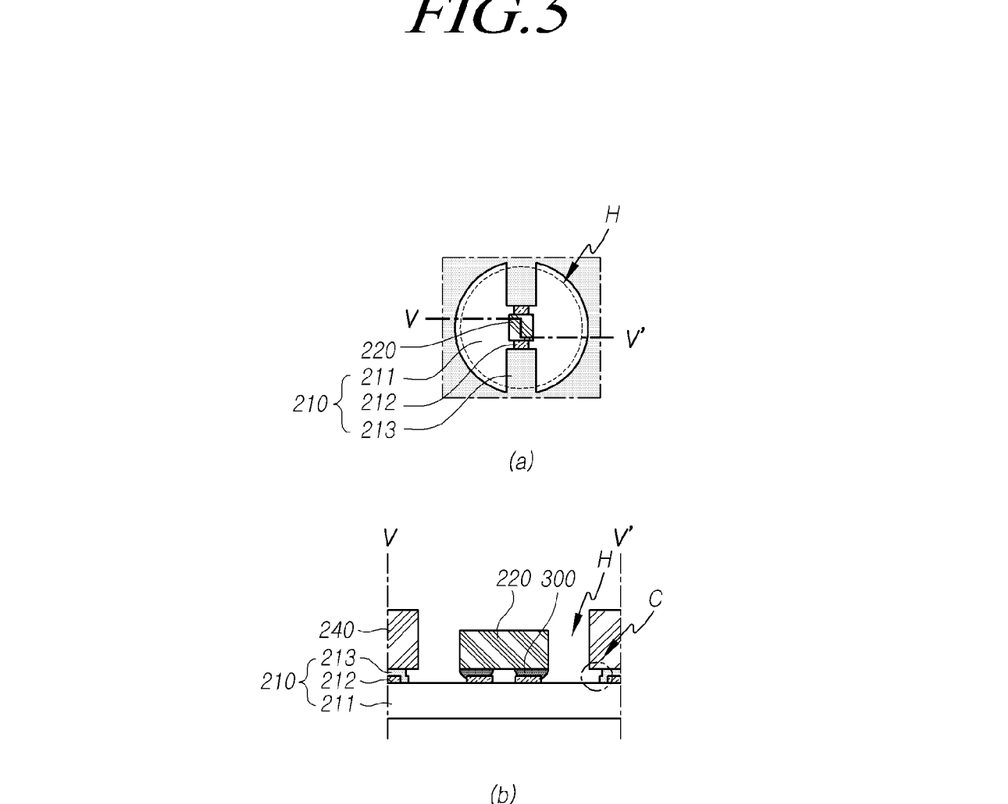

Referring to FIG. 5, part (a) of FIG. 5 illustrates an example planar structure of the printed circuit 210 in the area where the light source 220 is positioned. Part (b) of FIG. 5 illustrates an example cross-sectional structure of section V-V' in the structure shown in part (a).

Referring to FIG. 5, at least a portion of the cover layer 213 may be removed in an area overlapping the hole H.

The base layer 211 may be exposed in the area where the cover layer 213 is removed. A portion of the portion where the base layer 211 is exposed may be positioned outside the boundary of the hole H. The cover layer 213 may be removed from a portion of the area overlapping the reflector 240.

A wiring layer 212 may be positioned under the cover layer 213. In an area overlapping the reflector 240, the cover layer 213 may be disposed while surrounding a side surface of the wiring layer 212.

The cover layer 213 may be removed to the outside of the boundary of the hole H, increasing the exposed area of the base layer 211. Further, since the cover layer 213 covers the wiring layer 212 in the area overlapping the reflector 240, the portion where the wiring layer 212 having low reflectance is exposed may be minimized.

Further, in some cases, when the boundary of the portion where the cover layer 212 is removed matches the boundary of the hole H or is positioned inside the boundary of the hole H, the cover layer 212 may be disposed while covering the side surface of the wiring layer 212 in the area adjacent to the boundary of the hole H.

The wiring layer 212 having low reflectance may not be exposed inside the hole H except for a minimum portion to be connected to the light source 220.

Since the cover layer 212 and the base layer 211 having high reflectance are positioned in the area overlapping the hole H, and the proportion of the area where the base layer 211 having the highest reflectance is disposed increases, the light reflection efficiency inside the hole H may be enhanced.

Further, in some cases, a light scattering pattern may be disposed on the base layer 211, further enhancing image quality in the area surrounding the light source 220.

Figure 6:
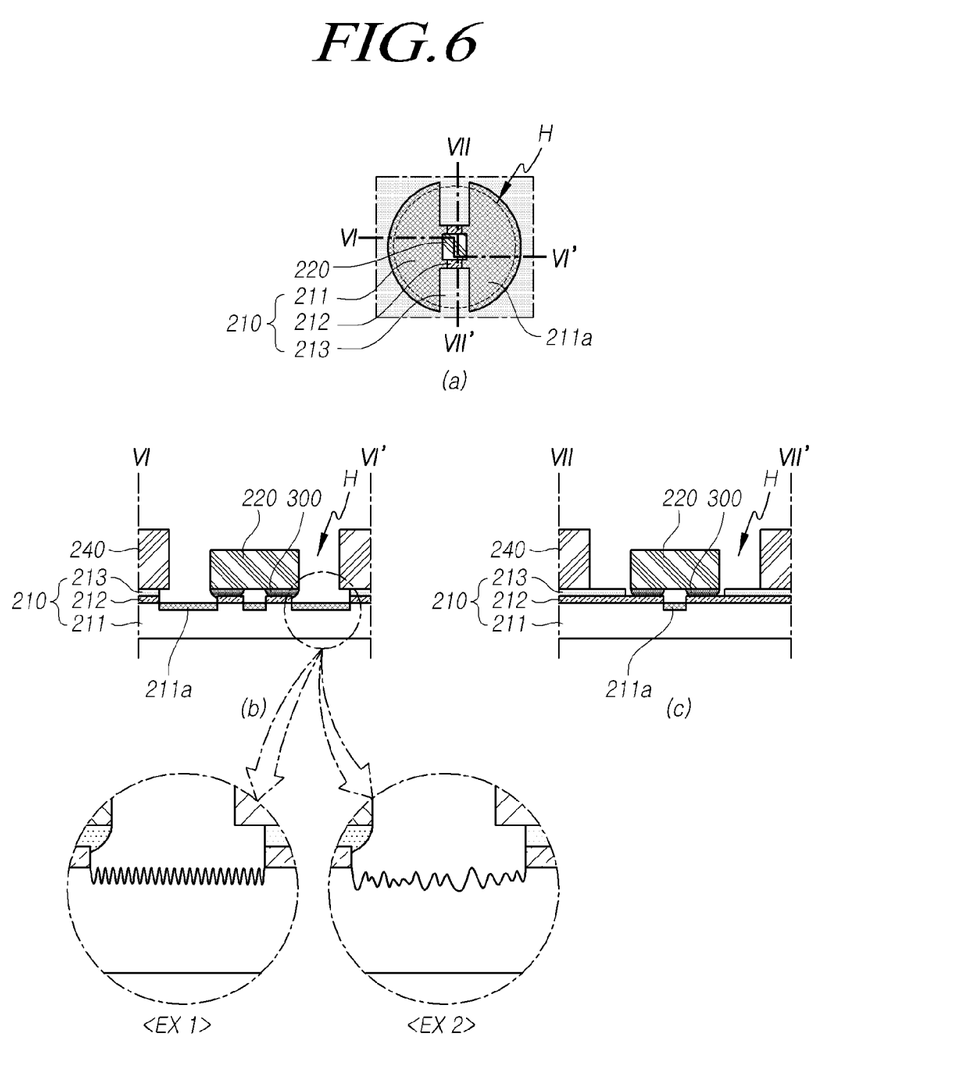
Figure 7:
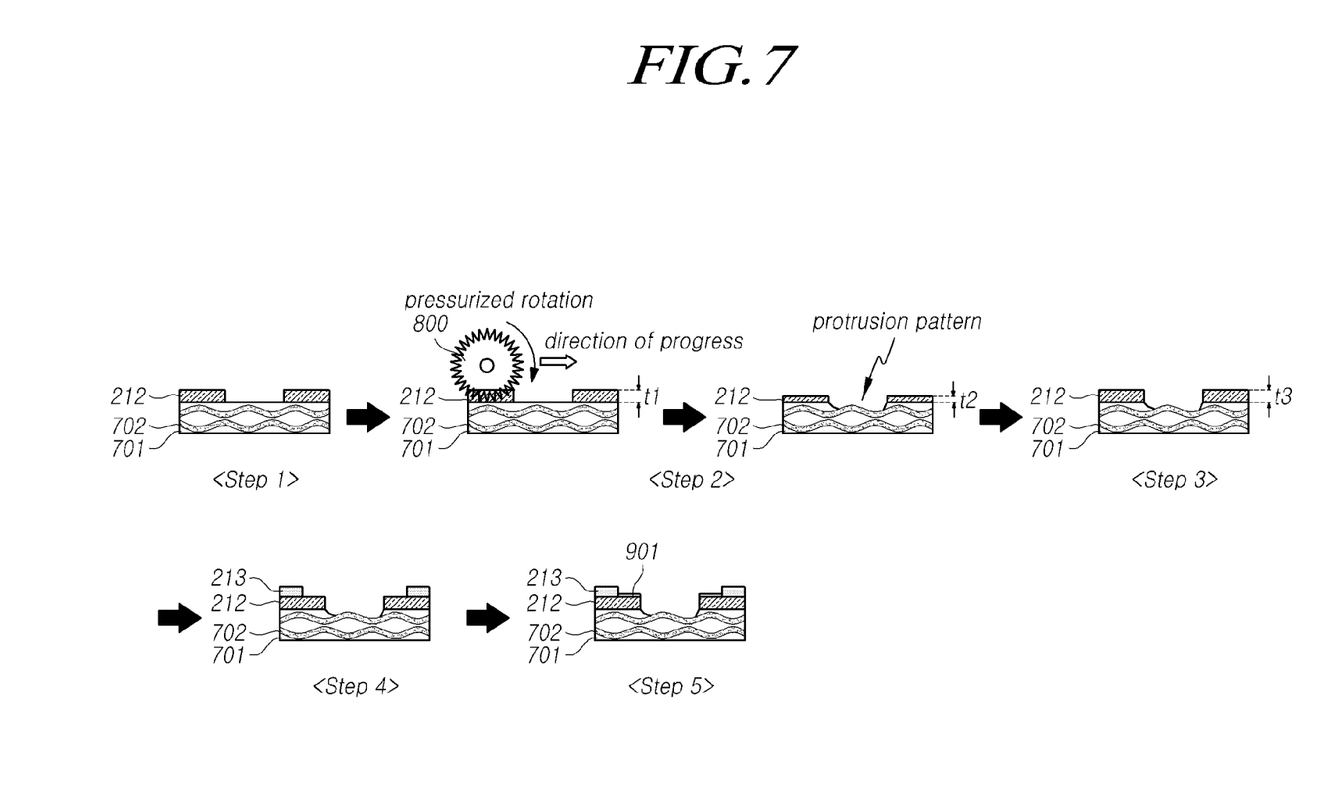
FIG. 7 is a view illustrating an example of a process of forming a protrusion pattern on a printed circuit included in a backlight unit according to embodiments of the disclosure.

Referring to FIG. 6, part (a) of FIG. 6 illustrates an example planar structure of the printed circuit 210 in the area where the light source 220 is positioned. Part (b) of FIG. 6 illustrates an example cross-sectional structure of section VI-VI' in the structure shown in part (a). Part (c) of FIG. 6 illustrates an example cross-sectional structure of section VII-VII' in the structure shown in part (a).

Referring to FIG. 6, at least a portion of the cover layer 213 of the printed circuit 210 may be removed in an area overlapping the hole H. The base layer 211 may be exposed in the area where the cover layer 213 is removed. A portion of the base layer 212 may be exposed in the area where the cover layer 213 is removed. The cover layer 213 may be disposed while covering most of the remaining portion except for the portion for connecting the wiring layer 212 to the light source 220.

The cover layer 213 may be removed to the outside of the boundary of the hole H, as in the above-described example. Alternatively, at least a portion of the area where the cover layer 213 is removed may overlap the boundary of the hole H. In some cases, the area where the cover layer 213 is removed may be positioned inside the boundary of the hole H.

A plurality of protrusion patterns 211a may be positioned on the upper surface of the base layer 211. The plurality of protrusion patterns 211a may be disposed by applying a separate material on the base layer 211. Alternatively, the plurality of protrusion patterns 211a may be disposed by a process of etching the upper surface of the base layer 211.

The plurality of protrusion patterns 211a may be, e.g., regular patterns as shown in <EX 1> or may be irregular patterns as shown in <EX 2>.

As shown in part (b) of FIG. 6, the plurality of protrusion patterns 211a may be positioned on the upper surface of the portion where the base layer 211 is exposed. Some of the plurality of protrusion patterns 211a may be positioned in an area overlapping the light source 220 as shown in part (c) of FIG. 6.

Since the plurality of protrusion patterns 211a are positioned on the upper surface of the portion where the base layer 211 is exposed in the area overlapping the hole H, the scattering effect of the light emitted from the light source 220 may be enhanced. Light efficiency and image quality may be enhanced by increasing the reflectance of light in the area overlapping the hole H.

The plurality of protrusion patterns 211a may be formed during the process of disposing the wiring layer 212 and the cover layer 213 on the base layer 211 included in the printed circuit 210. The plurality of protrusion patterns 211a may not be formed in the portion where the base layer 211 contacts the wiring layer 212 or the cover layer 213. The portion where the upper surface of the base layer 211 contacts the wiring layer 212 or the cover layer 213 may be flat.

FIG. 7 illustrates an example in which the base layer 211 of the printed circuit 210 is formed of epoxy 701 and glass fiber 702.

As shown in <Step 1>, a wiring layer 212 may be disposed on the base layer 211 including the epoxy 701 and the glass fiber 702.

As shown in <Step 2>, in a state where the wiring layer 212 is disposed on the base layer 211, the metal brush 800 pressurizes and rotates while passing over the upper surfaces of the base layer 211 and the wiring layer 212.

As the metal brush 800 passes over the upper surfaces of the base layer 211 and the wiring layer 212, at least a portion of the base layer 211 and the wiring layer 212 may be removed.

For example, a portion of the wiring layer 212 may be removed to reduce the thickness of the wiring layer 212 from a first thickness t1 to a second thickness t2.

The upper surface of the base layer 211 positioned in the area where the wiring layer 212 is not positioned may be etched by the metal brush 800. For example, most of the epoxy 701 included in the base layer 211 may be removed in the area where the wiring layer 212 is not positioned. In some cases, a portion of the epoxy 701 may remain. The glass fiber 702 included in the base layer 211 may remain in the area where the wiring layer 212 is not positioned. Alternatively, a portion of the glass fiber 702 may be etched into a protruding shape by the metal brush 800.

The upper surface of the base layer 211 positioned in the area overlapping the wiring layer 212 maintains a flat shape, and the upper surface of the base layer 211 positioned in the area where the wiring layer 212 is not disposed is etched, forming a plurality of protruding patterns 211a.

In <Step 3>, a plating process may be performed to compensate for the thickness of the etched wiring layer 212. The thickness of the wiring layer 212 may increase from the second thickness t2 to a third thickness t3.

In <Step 4>, a cover layer 213 may be disposed on the wiring layer 212. The cover layer 213 may be disposed while exposing the portion where the wiring layer 212 is connected to the light source 220.

The cover layer 213 may be disposed while overlapping the wiring layer 212 in the portion where the wiring layer 212 is not connected to the light source 220 or may be disposed to cover a side surface of the wiring layer 212.

In <Step 5>, a surface treatment process of disposing a coating layer 901 on the upper surface of the wiring layer 212 exposed as the cover layer 213 is not disposed may be performed.

As such, it is possible to enhance the light efficiency in the hole (H) area by increasing the proportion of the portion where the base layer 211 of the printed circuit 210 having high reflectance is exposed in the area overlapping the hole H of the reflector 240 where the light source 220 is positioned according to embodiments of the disclosure.

Further, the projection pattern 211a is formed on the upper surface of the base layer 211 to increase the scattering effect of light in the area of the hole H, increasing the scattering effect of light in the area where the light source 220 is positioned and hence enhancing image quality.

Embodiments of the disclosure described above are briefly described below.

A display device 100 according to embodiments of the disclosure may include a display panel 110 and a backlight unit supplying light to the display panel 110.

The backlight unit may include a printed circuit 210 including a base layer 211, a wiring layer 212 on the base layer 211, and a cover layer 213 on the wiring layer 212, a plurality of light sources 220 on the printed circuit 210, and a reflector 240 positioned on the printed circuit 210 and including a plurality of holes H positioned corresponding to the plurality of light sources 220.

At least a portion of the cover layer 213 may be removed in an area overlapping each of the plurality of holes H to expose the base layer 211. In the area overlapping each of the plurality of holes H, an area of a portion where the base layer 211 is exposed may be larger than an area of the cover layer 213.

An upper surface of the portion where the base layer 211 is exposed may include a plurality of protrusion patterns 211a.

Some of the plurality of protrusion patterns 211a may overlap the light source 220.

An upper surface of the base layer 211 contacting the wiring layer 212 or the cover layer 213 may be flat.

At least a portion of a boundary of each of the plurality of holes H may overlap the portion where the base layer 211 is exposed.

At least a portion of a boundary of each of the plurality of holes H may overlap an area between the light source 220 and the cover layer 213.

The portion where the base layer 211 is exposed may be positioned outside each of the plurality of holes H.

The portion where the base layer 211 may be exposed overlaps the reflector 240.

A gap between the light source 220 and a first point of the cover layer 213 may be different from a gap between the light source 220 and a second point of the cover layer 213.

A gap may be present between the light source 220 and the cover layer 213. The wiring layer 212 may be exposed in a portion of an area where the gap between the light source 220 and the cover layer 213 is smallest.

An area of a portion where the wiring layer 212 is exposed in an area overlapping each of the plurality of holes H may be smaller than an area of the portion where the base layer 211 is exposed.

A reflectance of the base layer 211 may be larger than a reflectance of the cover layer 213 and may be smaller than a reflectance of the reflector 240.

The display device 100 may further comprise a light source protection layer 250 disposed on the plurality of light sources 220 and the reflector 240 and having a portion positioned between the reflector 240 and the base layer 211.

A backlight unit according to embodiments of the disclosure may comprise a printed circuit 210 including a base layer 211, a wiring layer 212 on the base layer 211, and a cover layer 213 on the wiring layer 212, a plurality of light sources 220 on the printed circuit 210, and a reflector 240 positioned on the printed circuit 210 and including a plurality of holes H positioned corresponding to the plurality of light sources 220. At least a portion of the cover layer 213 may be removed in an area overlapping each of the plurality of holes H to expose the base layer 211. An area of a portion where the base layer 211 is exposed may be larger than an area of the cover layer 213.

A backlight unit according to embodiments of the disclosure may comprise a printed circuit 210 and a plurality of light sources 220 disposed on the printed circuit 210. The printed circuit 210 may include a first portion having a first reflectance around each of the plurality of light sources 220 and a second portion having a second reflectance lower than the first reflectance. A vertical distance between the first portion and the light source 220 may be larger than a vertical distance between the second portion and the light source 220.

An upper surface of the first portion may include a plurality of protrusion patterns 211a, and an upper surface of the second portion may be flat.

The backlight unit may further comprise a reflector 240 positioned on the printed circuit 210 and including a plurality of holes H overlapping at least a portion of the first portion.

An area of the first portion in an area overlapping each of the plurality of holes H may be larger than an area of the second portion.

A portion of the first portion may be positioned outside each of the plurality of holes H.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims.

What is claimed:

1. A display device, comprising:
a display panel; and
a backlight unit supplying light to the display panel,
wherein the backlight unit includes:
a printed circuit including a base layer, a wiring layer on the base layer, and a cover layer on the wiring layer;
a plurality of light sources on the printed circuit; and
a reflector positioned on the printed circuit and including a plurality of holes positioned corresponding to the plurality of light sources,
wherein at least a portion of the cover layer is removed in an area overlapping each of the plurality of holes to expose the base layer, and wherein in an area corresponding to the plurality of holes, an area where the base layer is exposed is larger than an area of the cover layer.

2. The display device of claim 1, wherein an upper surface of the portion where the base layer is exposed includes a plurality of protrusion patterns.

3. The display device of claim 2, wherein some of the plurality of protrusion patterns overlap the light source.

4. The display device of claim 2, wherein an upper surface of the base layer contacting the wiring layer or the cover layer is flat.

5. The display device of claim 1, wherein at least a portion of a boundary of each of the plurality of holes overlaps the portion where the base layer is exposed.

6. The display device of claim 1, wherein at least a portion of a boundary of each of the plurality of holes overlaps an area between the light source and the cover layer.

7. The display device of claim 1, wherein the portion where the base layer is exposed is positioned outside each of the plurality of holes.

8. The display device of claim 1, wherein the portion where the base layer is exposed overlaps the reflector.

9. The display device of claim 1, wherein a gap between the light source and a first point of the cover layer is different from a gap between the light source and a second point of the cover layer.

10. The display device of claim 1, wherein a gap is present between the light source and the cover layer, and wherein the wiring layer is exposed in a portion of an area where the gap between the light source and the cover layer is smallest.

11. The display device of claim 10, wherein an area of a portion where the wiring layer is exposed in an area overlapping each of the plurality of holes is smaller than an area of the portion where the base layer is exposed.

12. The display device of claim 1, wherein a reflectance of the base layer is larger than a reflectance of the cover layer and is smaller than a reflectance of the reflector.

13. The display device of claim 1, further comprising a light source protection layer disposed on the plurality of light sources and the reflector and having a portion positioned between the reflector and the base layer.

14. A backlight unit, comprising:
a printed circuit including a base layer, a wiring layer on the base layer, and a cover layer on the wiring layer;
a plurality of light sources on the printed circuit; and
a reflector positioned on the printed circuit and including a plurality of holes positioned corresponding to the plurality of light sources,
wherein at least a portion of the cover layer is removed in an area overlapping each of the plurality of holes to expose the base layer, and wherein an area of a portion where the base layer is exposed is larger than an area of the cover layer.

15. A backlight unit, comprising:
a printed circuit; and
a plurality of light sources disposed on the printed circuit,
wherein the printed circuit includes a first portion having a first reflectance around each of the plurality of light sources and a second portion having a second reflectance lower than the first reflectance, and wherein a vertical distance between the first portion and the light source is larger than a vertical distance between the second portion and the light source.

16. The backlight unit of claim 15, wherein an upper surface of the first portion includes a plurality of protrusion patterns, and an upper surface of the second portion is flat.

17. The backlight unit of claim 15, further comprising a reflector positioned on the printed circuit and including a plurality of holes overlapping at least a portion of the first portion.

18. The backlight unit of claim 17, wherein an area of the first portion in an area overlapping each of the plurality of holes is larger than an area of the second portion.

19. The backlight unit of claim 17, wherein a portion of the first portion is positioned outside each of the plurality of holes.

* * * * *